United States Patent
Lin et al.

(10) Patent No.: US 9,095,085 B2
(45) Date of Patent: Jul. 28, 2015

(54) METHOD OF MANUFACTURING A STACKED MULTILAYER STRUCTURE

(71) Applicant: KINSUS INTERCONNECT TECHNOLOGY CORP., Taoyuan (TW)

(72) Inventors: Ting-Hao Lin, Taipei (TW); Yu-Te Lu, Taoyuan Hsien (TW); De-Hao Lu, Taoyuan County (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 231 days.

(21) Appl. No.: 13/853,325

(22) Filed: Mar. 29, 2013

(65) Prior Publication Data

US 2014/0290057 A1      Oct. 2, 2014

(51) Int. Cl.
*H05K 3/40*      (2006.01)
*H05K 3/46*      (2006.01)

(52) U.S. Cl.
CPC ............ *H05K 3/4647* (2013.01); *H05K 3/4038* (2013.01); *H05K 2203/025* (2013.01); *H05K 2203/063* (2013.01); *Y10T 29/49155* (2015.01)

(58) Field of Classification Search
CPC ... H05K 3/465; H05K 3/4647; H05K 3/4038; H05K 2203/063; Y10T 29/49155
See application file for complete search history.

(56) References Cited

U.S. PATENT DOCUMENTS

| | | | | |
|---|---|---|---|---|
| 4,159,222 A | * | 6/1979 | Lebow et al. | 216/20 |
| 5,102,718 A | * | 4/1992 | Tingerthal et al. | 428/209 |
| 5,196,089 A | * | 3/1993 | Takada et al. | 216/13 |
| 6,884,709 B2 | * | 4/2005 | Iijima et al. | 438/613 |
| 8,153,901 B2 | * | 4/2012 | Kondo | 174/250 |

FOREIGN PATENT DOCUMENTS

JP      3907062 B2 *   4/2007

OTHER PUBLICATIONS

Machine translation of JP3907062B, obtained Jan. 11, 2015.*

* cited by examiner

*Primary Examiner* — Livius R Cazan
(74) *Attorney, Agent, or Firm* — Lin & Associates IP, Inc.

(57) ABSTRACT

Disclosed is a method of manufacturing a stacked multilayer structure, including the steps of forming a first circuit layer with bumps on a substrate, punching an aluminum plate to form recesses corresponding to the bumps, forming openings in a plastic film including a glass fiber layer corresponding to the bumps, pressing the aluminum plate, the plastic film and the substrate, removing the aluminum plate, polishing to level the resulting surface, forming a second circuit layer connected to the first circuit layer, and finally removing the substrate to form the stacked multilayer structure. Because the glass fiber layer in the plastic film is not exposed after polishing, the thickness of the dielectric layer is uniform and the reliability of the circuit layer is improved so as to increase the yield.

8 Claims, 13 Drawing Sheets

METHOD OF MANUFACTURING A STACKED MULTILAYER STRUCTURE

BACKGROUND OF THE INVENTION

1. Field of the Invention

The present invention generally relates to a method of manufacturing a stacked multilayer structure, and more specifically to using an aluminum plate with recesses and a plastic film with openings to perform pressing and form the stacked multilayer structure without exposing the glass fiber layer embedded in the plastic film so as to increase the reliability of a second circuit layer.

2. The Prior Art

Please refer to FIG. 1 and FIGS. 2A to 2G. As shown in FIG. 1, the method S100 of manufacturing the stacked multilayer structure in the prior art comprises the steps S110 to S160. FIGS. 2A to 2G are used to illustrate the method in more detail As shown in FIG. 2A, a substrate 10 is stacked with a first circuit layer 20 through the process of image transfer in the step S110. The first circuit layer 20 has a plurality of bumps 21. The step S120 is performed to press the plastic film 30 having a glass fiber layer 35 therein against the substrate 10 having the first circuit layer 20 thereon, as shown in Figs.2B and 2C. After being pressed, the glass fiber layer 35 is obviously deformed because the first circuit layer 20 is not smooth.

In the step S130, the pressed plastic film 30 is polished until the bumps 21 are exposed such that part of the glass fiber layer 35 above the bumps 21 is removed and the remaining part of the glass fiber layer 35 is thus exposed, as shown in FIG. 2D. Next, in the step S140 as shown in FIG. 2E, a second metal layer 23 is formed on the resulting surface by evaporation or sputtering. The step S150 is performed to form a second circuit layer 25 from the second metal layer 23 by the process of image transfer such that the second circuit layer 25 is connected to the first circuit layer 20, as shown in FIG. 2F. Finally, the substrate 10 is removed in the step S160 to form the stacked multilayer structure, as shown in FIG. 2G.

One shortcomings in the prior art is that the second metal layer 23 or the second circuit layer 25 is likely to peel off because the glass fiber layer is partly exposed and the adhesion between the glass fiber layer and the metal is considerably poor even if the second metal layer 23 is formed by evaporation or sputtering. As a result, the yield and reliability greatly deteriorate. Therefore, it is needed to provide a new method of manufacturing a stacked multilayer structure to overcome the above problems in the prior art.

SUMMARY OF THE INVENTION

The primary objective of the present invention is to provide a method of manufacturing a stacked multilayer structure, comprising the steps of forming a first circuit layer with bumps on a substrate by a process of image transfer, punching an aluminum plate to form recesses corresponding to the bumps, forming a metal layer to cover the aluminum plate and sidewalls of the recesses, forming openings in a plastic film having a glass fiber layer corresponding to the bumps, using the aluminum plate to press the plastic film against the first circuit layer on the substrate to deform the plastic film such that a plurality of projection parts are formed on the plastic film with respect to the recesses of the aluminum plate and the bumps are under the projection parts, removing the aluminum plate; polishing the projection parts to form a smooth upper surface and expose the bumps, forming a second metal layer on the smooth upper surface, forming a second circuit layer by performing the process of image transfer on the second metal layer such that the second circuit layer is connected to the first circuit layer; and removing the substrate to form the stacked multilayer structure Preferably, the steps of forming the first circuit layer, punching the aluminum plate and forming the openings of the plastic film are simultaneously performed.

The glass fiber layer in the plastic film is not deformed or exposed after the step of pressing the plastic film having the glass fiber layer by the aluminum plate having the recesses. Also, only the projection parts on the plastic film corresponding to the recesses of the aluminum plate need to be polished such that the glass fiber layer in the plastic film is not exposed after polishing. As a result, the second circuit layer does not peel off due to the poor adhesion between the glass fiber layer and the metal. Therefore, the method of the present invention can effectively increase the reliability of the circuit layer and improve the yield.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
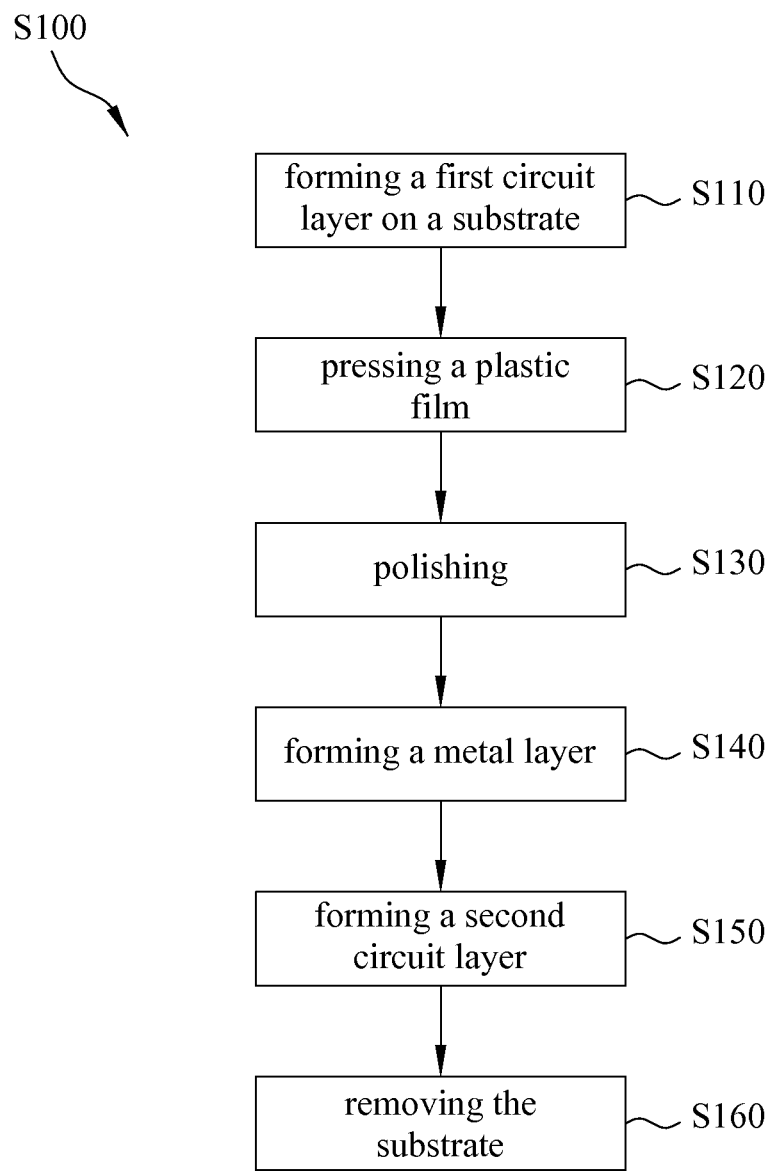
FIG. 1 shows the method of manufacturing the stacked multilayer structure in the prior art.
Figure 2A:
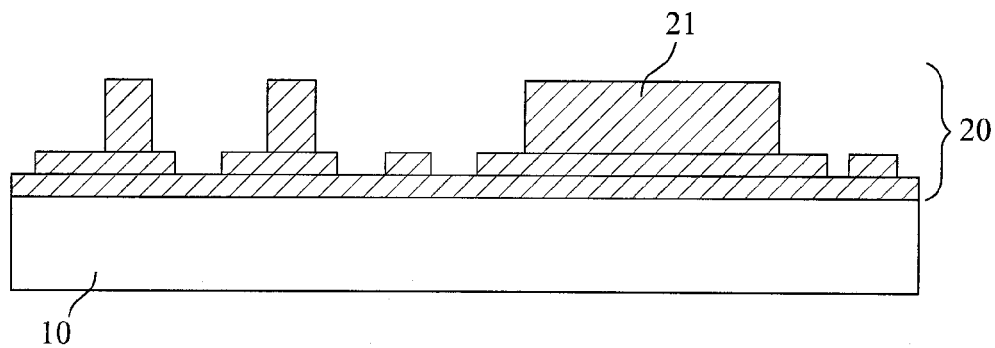
FIGS. 2A to 2G are views showing the steps of the method in the prior art, respectively.
Figure 2B:
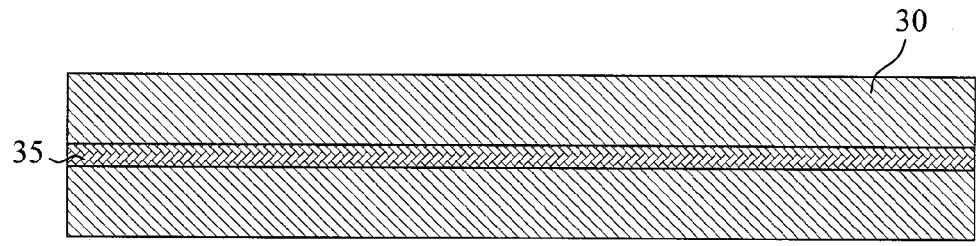
Figure 2B:
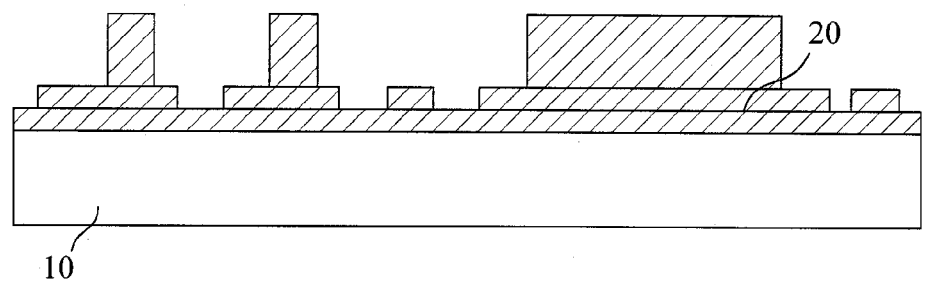
Figure 2C:
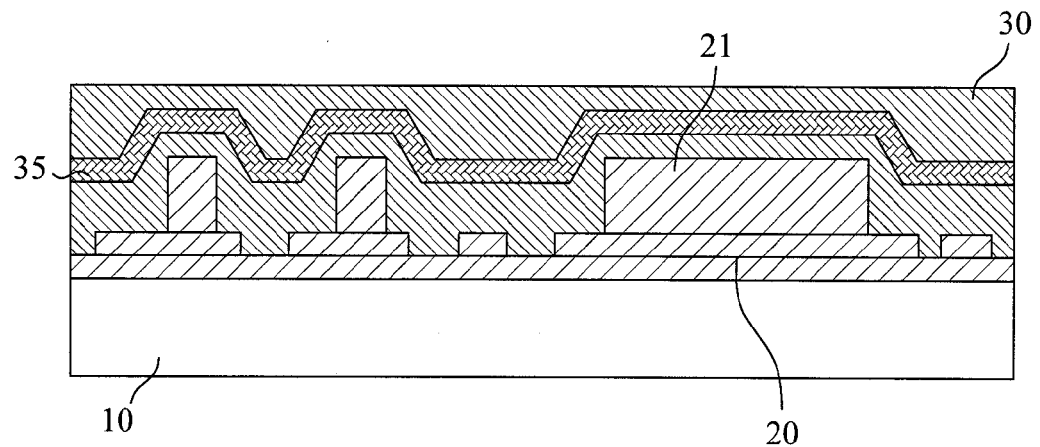
Figure 2D:
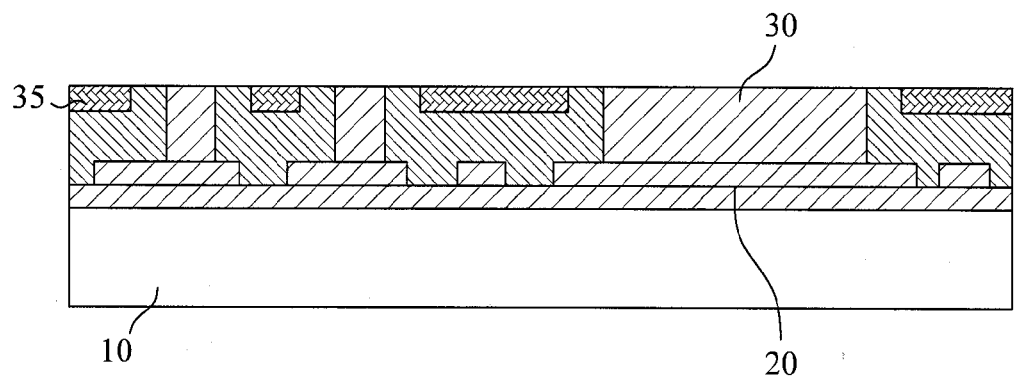
Figure 2E:
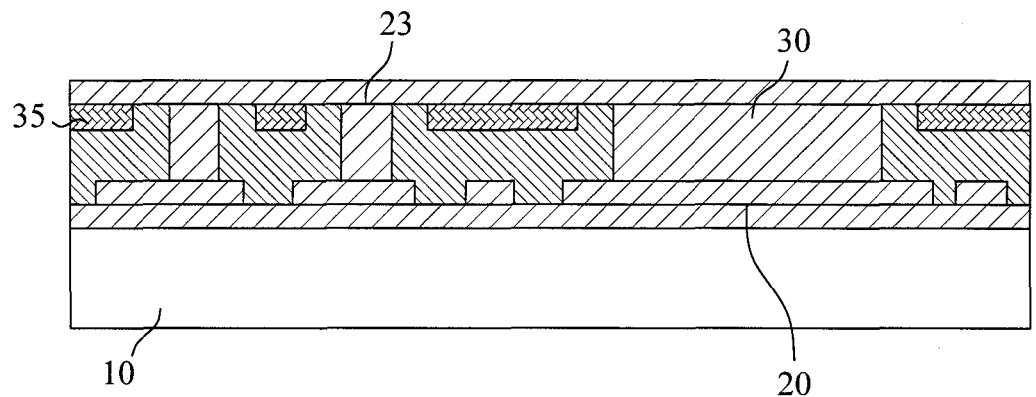
Figure 2F:
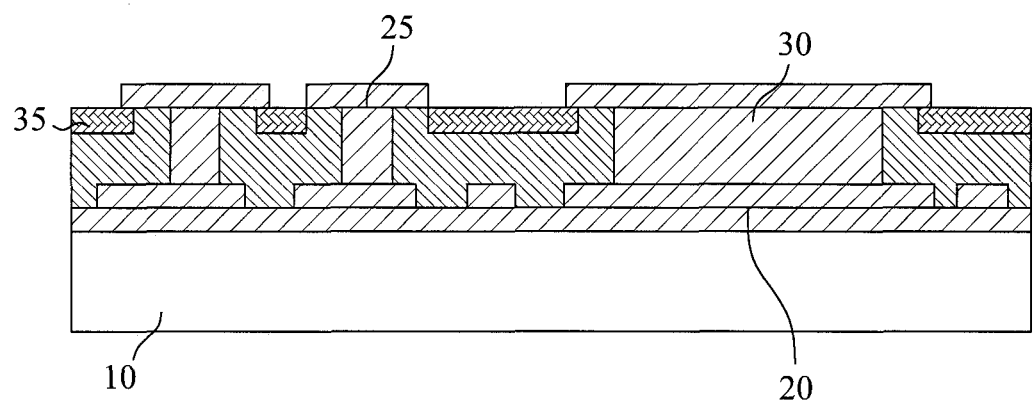
Figure 2G:
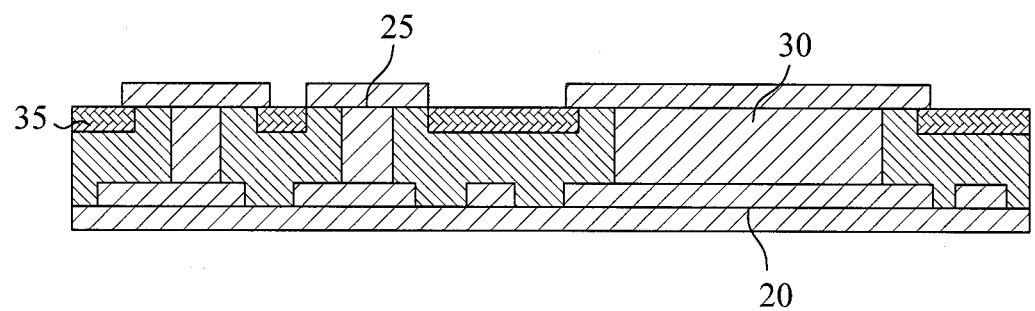
Figure 3:
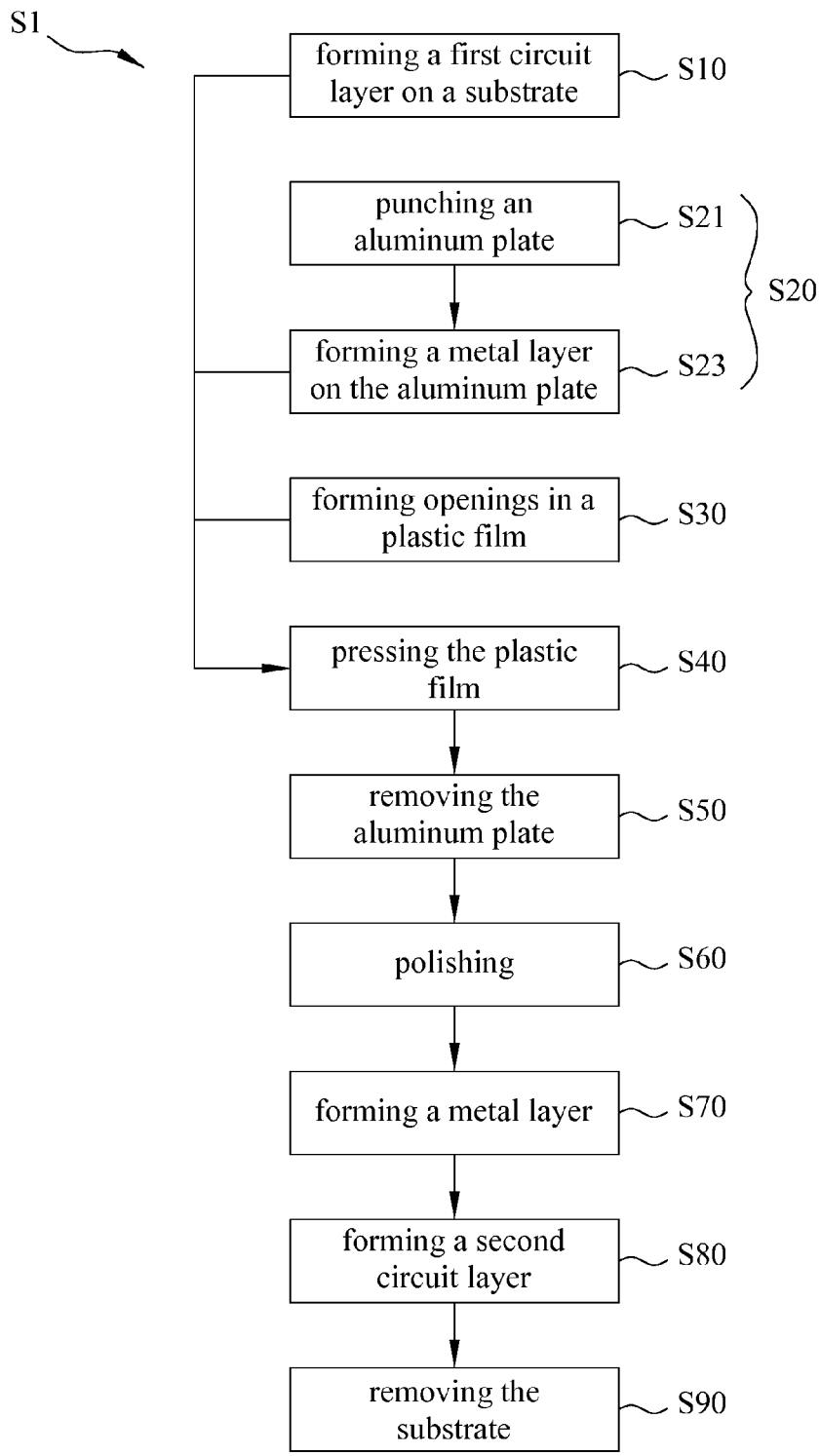
FIG. 3 is a flow diagram of the method of manufacturing the stacked multilayer structure according to one embodiment of the present invention.

Please refer to FIG. 3 and FIGS. 4A to 4L for illustrating the method of manufacturing the stacked multilayer structure according to one embodiment of the present invention. As shown in FIG. 3, the method S1 of manufacturing the stacked multilayer structure comprises the steps S10, S20, S30, S40, S50, S60, S70 and S80 to form a first circuit layer on a substrate, form an aluminum plate, form openings, press, remove the aluminum plate, polish, form a second metal layer and form a second circuit layer, respectively. Preferably, the steps S10, S20 and S30 are simultaneously performed. The step S20 further comprises the steps S21 and S23 to punch the aluminum plate and form a metal layer on the punched aluminum plate, respectively. The characteristics of the method according to present invention will be described in detail with reference to FIGS. 4A to 4L.

Figure 4A:
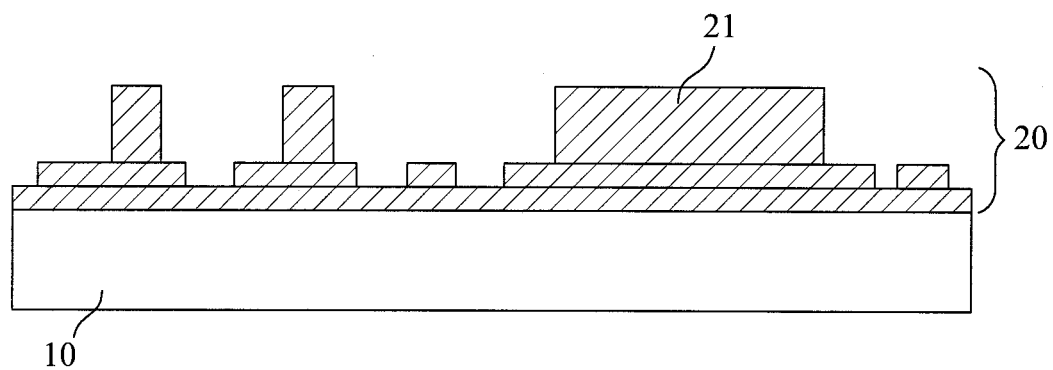
FIGS. 4A to 4L are views showing the steps of the method according to the present invention.
Figure 4B:
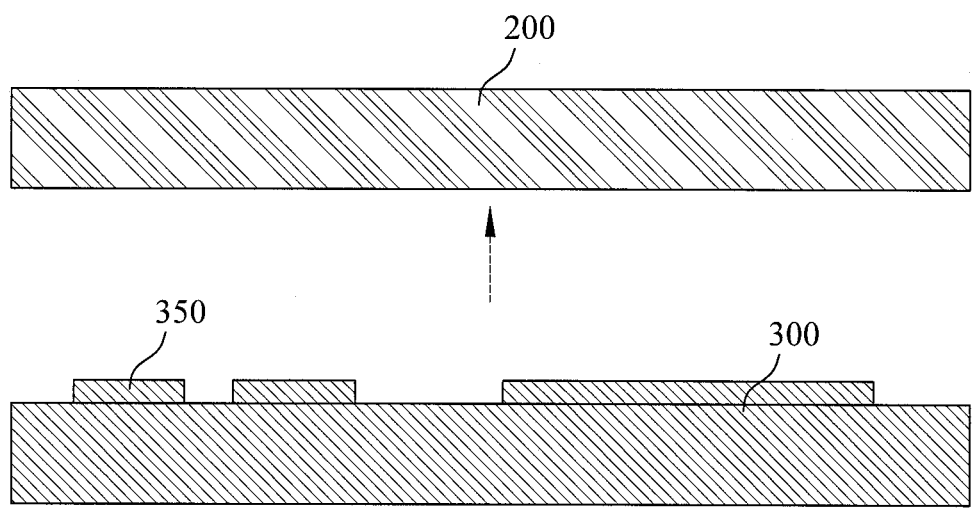
Figure 4C:
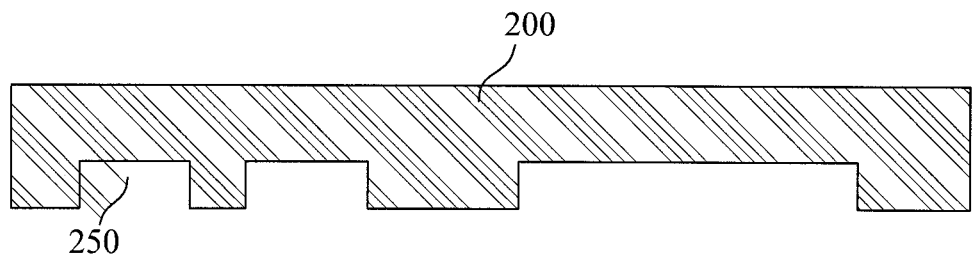
Figure 4D:
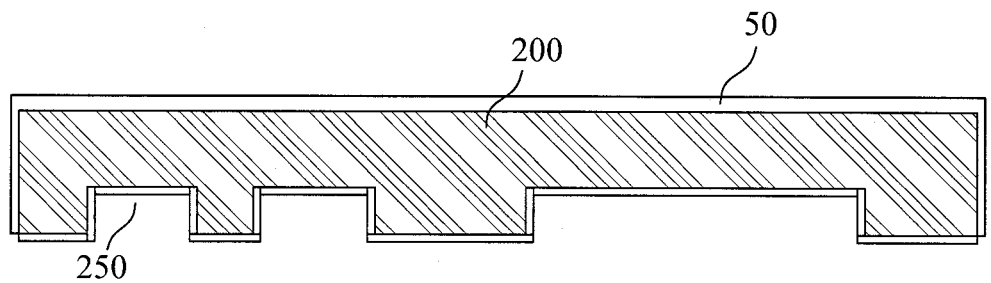

As shown in FIG. 4A, the step S10 is performed to form the first circuit layer 20 on the substrate 10 by the process of image transfer and the first circuit layer 20 has a plurality of bumps 21. Next, the aluminum plate 200 with a smooth surface is punched by a punching mold 300 having a plurality of projections 350 corresponding to the bumps 21 in the step S21, as shown in FIG. 4B. Thus, a plurality of recesses 250 are formed on the aluminum plate 200 by the projections 350 of the punching mold 300 and the recesses 250 correspond to the projections 350, as shown in FIG. 4C. In the step S23, the metal layer 50 is formed on the punched aluminum plate 200 to cover the surface of the aluminum plate 200 and the sidewalls of the recesses 250, as shown in FIG. 4D. Specifically, the metal layer 50 is formed of at least one of copper, gold, silver, palladium, and nickel and the step S23 is performed by electroplating, non electroplating electroless plating, evaporation, sputtering or atomic layer deposition.

Figure 4E:
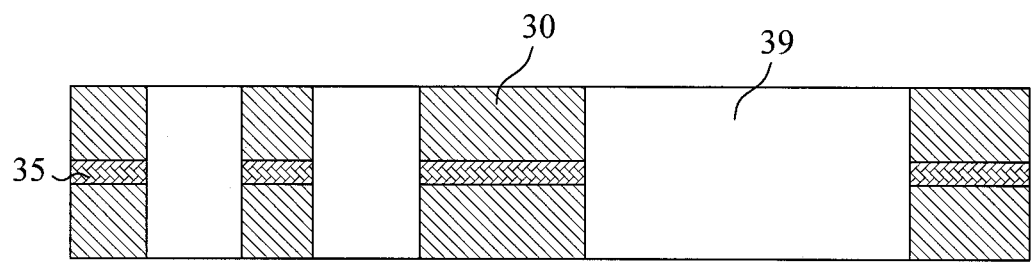
Figure 4F:
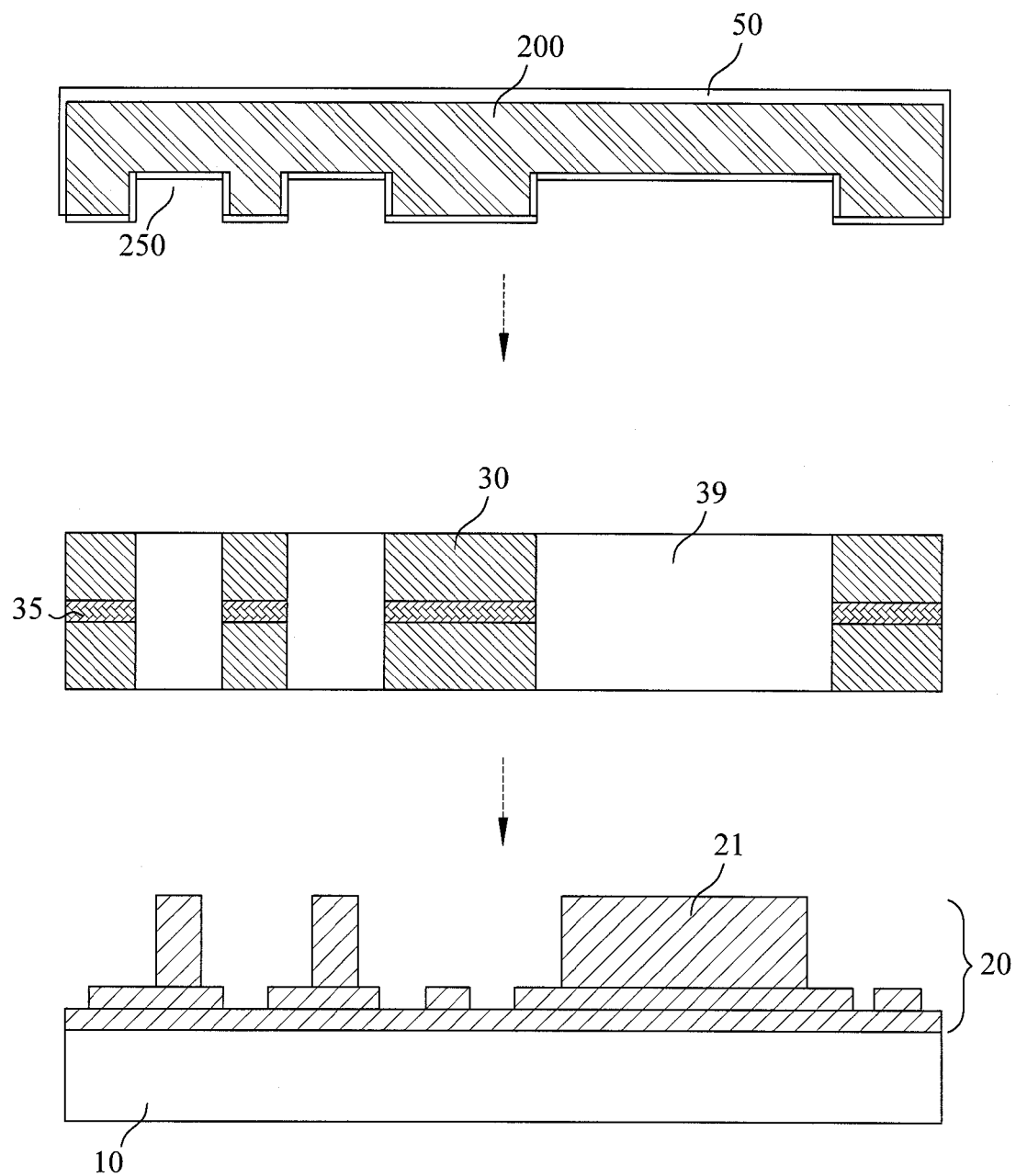
Figure 4G:
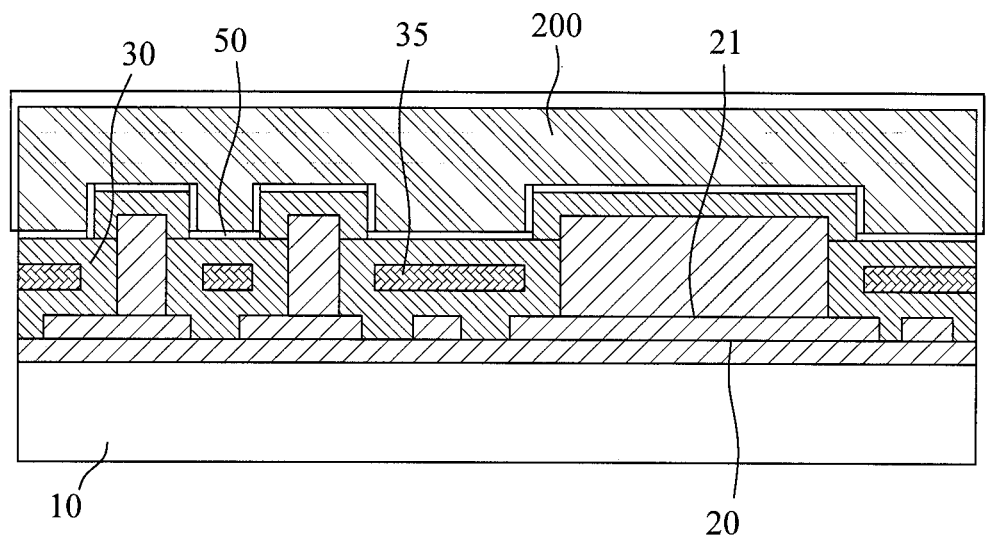

As shown in FIG. 4E, the step S30 is performed to form a plurality of openings 39 in the plastic film 30 having a glass fiber layer 35 and the openings 39 are configured to correspond to the bumps 21. As shown in FIGS. 4F and 4G, in the step S40, the aluminum plate 200 is used to press the plastic film 30 against the first circuit layer 20 on the substrate 10 to deform the plastic film 30 such that a plurality of projection parts are formed on the plastic film 30 with respect to the recesses 250 of the aluminum plate 200 and the bumps 21 are under the projection parts.

Figure 4H:
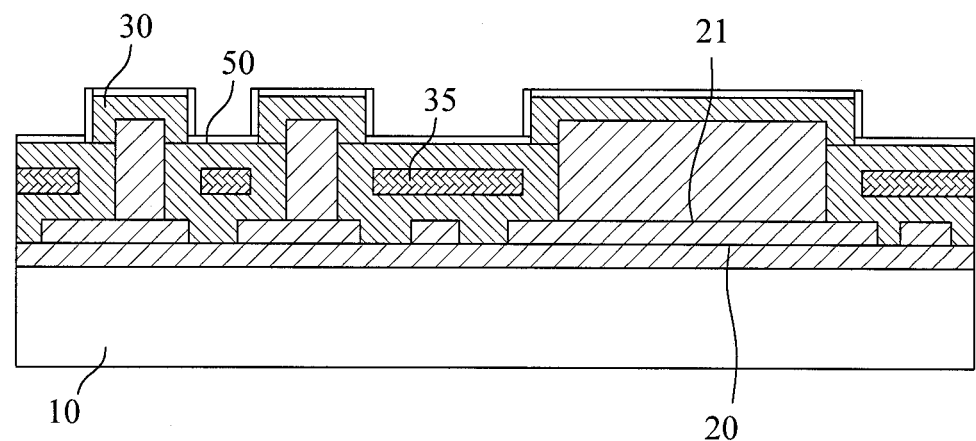
Figure 4I:
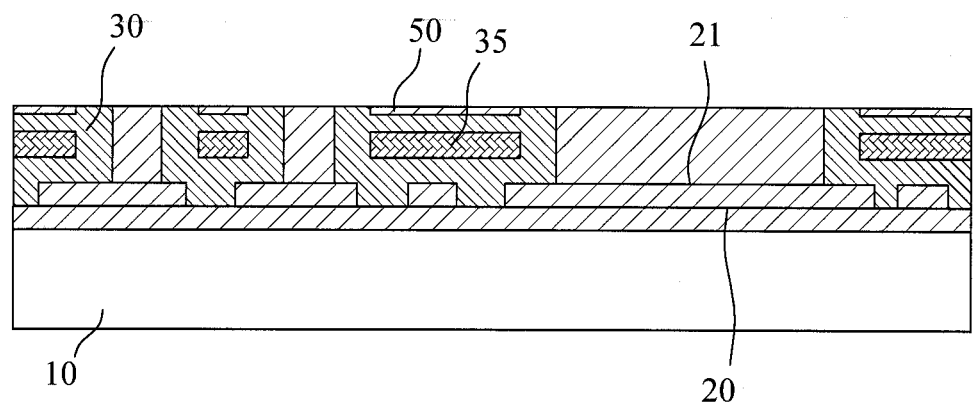

Next, the step S50 is performed to remove the aluminum plate 200, as shown in FIG. 4H. In the step S60, the projection parts are polished to expose the bumps 21 of the first circuit layer 20 so as to form a smooth upper surface, as shown in FIG. 4I. As a result, part of the metal layer 50 remains on the plastic film 30 and the glass fiber layer is still in the plastic film 30.

Figure 4J:
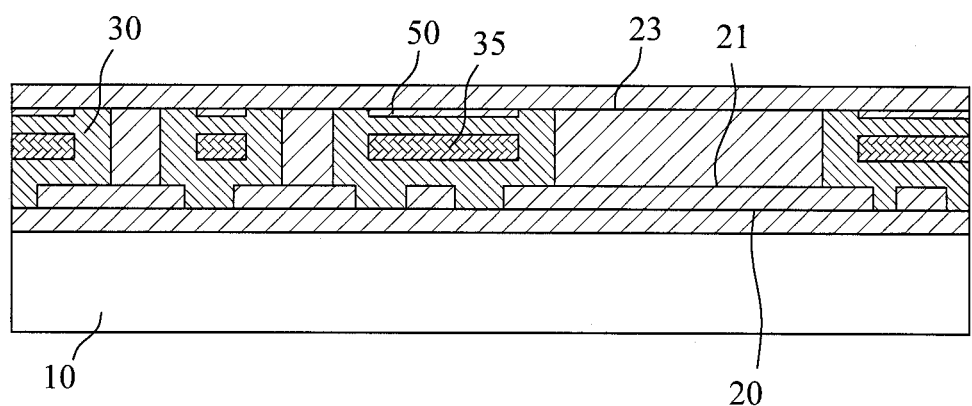
Figure 4K:
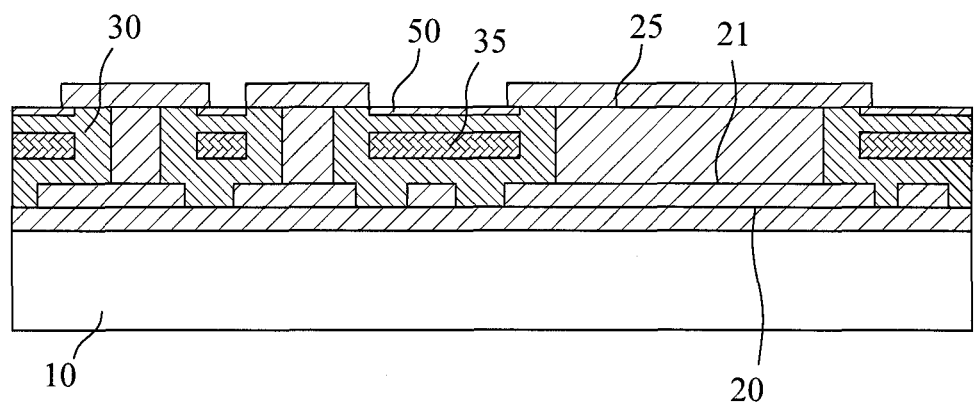
Figure 4L:
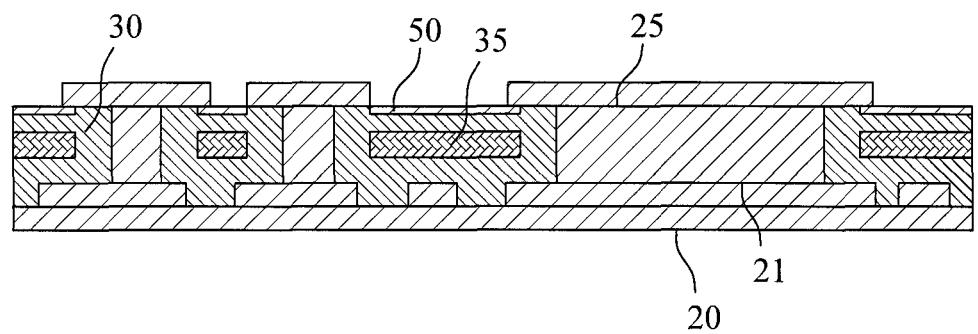

As shown in FIG. 4J, the step S70 is then performed to form the second metal layer 23 on the co-plane formed by the bumps 21, the metal layer 50 and the plastic film 30. More specifically, the step S70 is performed by electroplating, non electroplating electroless plating, evaporation, sputtering or atomic layer deposition. Next, the second circuit layer 25 is formed in the step S80 by performing the process of image transfer on the second metal layer 23 such that the second circuit layer 25 is connected to the first circuit layer 20, as shown in FIG. 4K. Preferably, the first circuit layer 20 and the second circuit layer 25 are formed of at least one of copper, gold, silver, aluminum, palladium, and nickel. Finally, as shown in FIG. 4L, the substrate 10 is removed to form the stacked multilayer structure in the step S90.

As apparently seen from the above description, one aspect of the present invention is that the plastic film having the openings is pressed against the first circuit layer by the aluminum plate having the recesses, and the glass fiber layer in the plastic film is not deformed. Also, only the projection parts on the plastic film corresponding to the recesses of the aluminum plate need to be polished such that the glass fiber layer in the plastic film is not exposed after polishing. Consequently, the second circuit layer does not peel off due to the poor adhesion between the glass fiber layer and the metal. The method of the present invention can thus effectively increase the reliability of the circuit layer and greatly improve the yield.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of manufacturing a stacked multilayer structure, comprising the steps of:
    forming a first circuit layer with bumps on a substrate by a process of image transfer;
    punching an aluminum plate to form recesses corresponding to the bumps;
    forming a metal layer to cover the aluminum plate and sidewalls of the recesses;
    forming, in a plastic film having a glass fiber layer, openings corresponding to the bumps;
    using the aluminum plate to press the plastic film against the first circuit layer on the substrate to deform the plastic film such that a plurality of projection parts are formed on the plastic film with respect to the recesses of the aluminum plate and the bumps are under the projection parts;
    removing the aluminum plate;
    polishing the projection parts to form a smooth upper surface and expose the bumps;
    forming a second metal layer on the smooth upper surface;
    forming a second circuit layer by performing the process of image transfer on the second metal layer such that the second circuit layer is connected to the first circuit layer; and
    removing the substrate to form the stacked multilayer structure.

2. The method as claimed in claim 1, wherein the steps of forming the first circuit layer, punching the aluminum plate and forming the openings of the plastic film are simultaneously performed.

3. The method as claimed in claim 1, wherein the step of punching an aluminum plate is performed by using a press mold having a plurality of projections to punch the aluminum plate so as to form, on the aluminum plate, the recesses corresponding to the bumps, and
    wherein the step of forming the metal layer is performed by electroplating, electroless plating, evaporation, sputtering or atomic layer deposition and the metal layer is formed of at least one of copper, gold, silver, palladium, and nickel.

4. The method as claimed in claim 1, wherein part of the metal layer remains on the plastic film after the step of removing the substrate.

5. The method as claimed in claim 1, wherein part of the metal layer remains on the plastic film after the step of polishing the projection parts.

6. The method as claimed in claim 1, wherein the second metal layer is formed by electroplating, electroless plating, evaporation, sputtering or atomic layer deposition.

7. The method as claimed in claim 1, wherein the first circuit layer and the second circuit layer are formed of at least one of copper, gold, silver, aluminum, palladium, and nickel.

8. The method as claimed in claim 1, wherein the glass fiber layer remains in the plastic film after the step of polishing the projection parts.

* * * * *